United States Patent
Sakai

(10) Patent No.: US 11,694,948 B2
(45) Date of Patent: Jul. 4, 2023

(54) SEMICONDUCTOR DEVICE AND SEMICONDUCTOR MODULE USING SAME

(71) Applicant: Mitsubishi Electric Corporation, Tokyo (JP)

(72) Inventor: Masashi Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 107 days.

(21) Appl. No.: 17/506,286

(22) Filed: Oct. 20, 2021

(65) Prior Publication Data

US 2022/0328384 A1 Oct. 13, 2022

(30) Foreign Application Priority Data

Apr. 12, 2021 (JP) ................. 2021-066882

(51) Int. Cl.
  *H01L 23/48* (2006.01)
  *H01L 23/495* (2006.01)
  *H01L 23/00* (2006.01)
  *H01L 25/07* (2006.01)
  *H01L 25/18* (2023.01)

(52) U.S. Cl.
  CPC .. *H01L 23/49568* (2013.01); *H01L 23/49524* (2013.01); *H01L 23/49575* (2013.01); *H01L 24/37* (2013.01); *H01L 24/40* (2013.01); *H01L 25/072* (2013.01); *H01L 25/18* (2013.01); *H01L 2224/37011* (2013.01); *H01L 2224/37012* (2013.01); *H01L 2224/40137* (2013.01); *H01L 2224/40245* (2013.01)

(58) Field of Classification Search
  CPC .. H01L 25/18; H01L 25/072; H01L 24/37–40
  See application file for complete search history.

(56) References Cited

U.S. PATENT DOCUMENTS

| | | | |
|---|---|---|---|
| 2017/0110395 A1 | 4/2017 | Iwabuchi et al. | |
| 2017/0133294 A1* | 5/2017 | Ikeda | H01L 25/18 |
| 2017/0271297 A1* | 9/2017 | Matsuoka | H01L 23/49575 |
| 2017/0317006 A1* | 11/2017 | Okumura | H01L 25/072 |

FOREIGN PATENT DOCUMENTS

JP 2015-185834 A 10/2015

* cited by examiner

*Primary Examiner* — Hoa B Trinh

(74) *Attorney, Agent, or Firm* — Sughrue Mion, PLLC; Richard C. Turner

(57) ABSTRACT

This semiconductor device includes: a plate-shaped heat dissipation plate; a plurality of switching elements joined to one surface of the heat dissipation plate; a first terminal located apart from the heat dissipation plate, extending in a direction away from the heat dissipation plate, and connected via first conductors to surfaces of the switching elements on a side opposite to the heat dissipation plate side; and a sealing member sealing the switching elements, the heat dissipation plate, and the first terminal. A cutout is provided at an outer periphery of the heat dissipation plate. A part of the first terminal on the heat dissipation plate side overlaps a cut-out area at the cutout as seen in a direction perpendicular to the one surface of the heat dissipation plate. A retracted portion retracted inward is formed at an outer periphery of another surface of the heat dissipation plate.

9 Claims, 21 Drawing Sheets

SEMICONDUCTOR DEVICE AND SEMICONDUCTOR MODULE USING SAME

BACKGROUND OF THE INVENTION

1. Field of the Invention

The present disclosure relates to a semiconductor device and a semiconductor module using the same.

2. Description of the Background Art

An electric vehicle such as an electric automobile or a plug-in hybrid automobile is provided with a power conversion device for converting power from a high-voltage battery. For the power conversion device, a semiconductor device that converts power through switching operation is used.

The semiconductor device includes a semiconductor switching element joined to a metal plate having heat dissipation property. The semiconductor switching element is connected, by means such as direct-lead-bonding (DLB) or wire bonding, to a main terminal forming a power circuit for power conversion and a control terminal connected to a control circuit for performing switching control. The semiconductor switching element is sealed by a sealing member such as resin or gel, and thus a sealing portion is formed so as to surround the semiconductor switching element. In one disclosed semiconductor device, the main terminal and the control terminal corresponding to the same semiconductor switching element protrude from one protrusion surface of the sealing portion and are arranged along the protrusion surface (see, for example, Patent Document 1).

In the disclosed semiconductor device, via a heat dissipation plate connected to a main electrode on the back surface of the semiconductor element, the main electrode of the semiconductor element and the main terminal are electrically connected to each other. Meanwhile, the control terminal is connected to a control electrode of the semiconductor element via a bonding wire. Such main terminals and control terminals protrude from one protrusion surface of the sealing portion and are arranged along the protrusion surface.

Patent Document 1: Japanese Laid-Open Patent Publication No. 2015-185834

In the structure of the semiconductor device in Patent Document 1, since the heat dissipation plate is connected to the main electrode on the back surface of the semiconductor element, current flows through the heat dissipation plate. Therefore, the semiconductor device is attached to a cooler with an insulating member such as an insulating plate interposed therebetween. In the case where the semiconductor device is attached to the cooler with the insulating plate interposed therebetween, it is necessary to ensure a creepage distance between the heat dissipation plate and the cooler, thus causing a problem of increasing the size of the insulating plate with which the semiconductor device contacts.

SUMMARY OF THE INVENTION

Accordingly, an object of present disclosure is to obtain a semiconductor device that enables suppression of size increase of an insulating member with which the semiconductor device contacts, and a semiconductor module that enables suppression of size increase.

A semiconductor device according to the present disclosure includes: a heat dissipation plate formed in a plate shape; a plurality of switching elements joined to one surface of the heat dissipation plate; a first terminal located apart from the heat dissipation plate and extending in a direction away from the heat dissipation plate, the first terminal being connected via first conductors to surfaces of the plurality of switching elements on a side opposite to the heat dissipation plate side; and a sealing member sealing the plurality of switching elements, the heat dissipation plate, and the first terminal. A cutout is provided at an outer periphery of the heat dissipation plate. A part of the first terminal on the heat dissipation plate side overlaps a cut-out area at the cutout as seen in a direction perpendicular to the one surface of the heat dissipation plate. A retracted portion retracted inward is formed at an outer periphery of another surface of the heat dissipation plate.

A semiconductor module according to the present disclosure includes: the semiconductor device according to the present disclosure; and a plate-shaped insulating member contacting with the other surface of the heat dissipation plate excluding the retracted portion.

The semiconductor device according to the present disclosure includes the heat dissipation plate formed in a plate shape and the plurality of switching elements joined to the one surface of the heat dissipation plate, and the retracted portion retracted inward is formed at the outer periphery of the other surface of the heat dissipation plate. Therefore, in the creepage distance between the heat dissipation plate and the cooler when the semiconductor device is attached to the cooler with the insulating plate interposed therebetween, a horizontal distance from a side surface part of the heat dissipation plate to a side surface of the insulating plate can be made smaller than a horizontal distance in a case where the retracted portion is not formed. Thus, size increase of the insulating plate with which the semiconductor device contacts can be suppressed.

The semiconductor module according to the present disclosure includes the semiconductor device according to the present disclosure and the plate-shaped insulating member contacting with the other surface of the heat dissipation plate excluding the retracted portion. Thus, since size increase of the insulating plate is suppressed, size increase of the semiconductor module can be suppressed.

DETAILED DESCRIPTION OF THE PREFERRED EMBODIMENTS OF THE INVENTION

Figure 1:
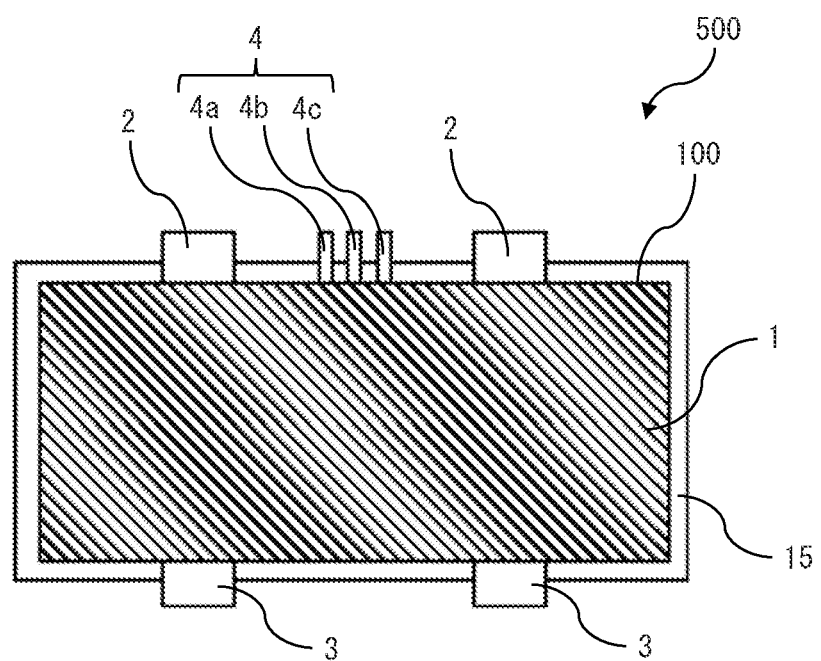
FIG. 1 is a top view showing the outer appearance of a semiconductor module according to the first embodiment of the present disclosure.

Hereinafter, a semiconductor device according to embodiments of the present disclosure will be described with reference to the drawings. In the drawings, the same or corresponding members and parts are denoted by the same reference characters, to give description.

First Embodiment

Figure 2:
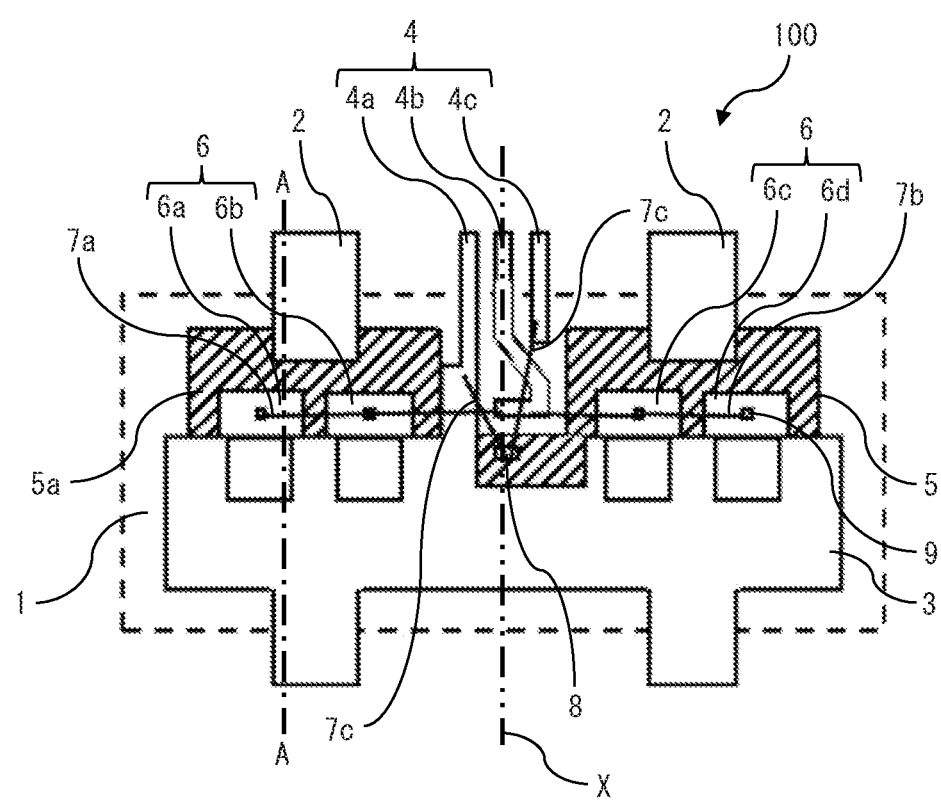
FIG. 2 is a plan view schematically showing the structure of a semiconductor device according to the first embodiment.
Figure 3:
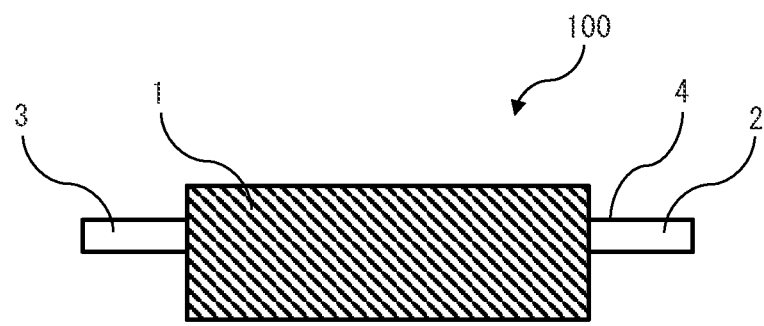
FIG. 3 is a side view showing the outer appearance of the semiconductor device according to the first embodiment.
Figure 4:
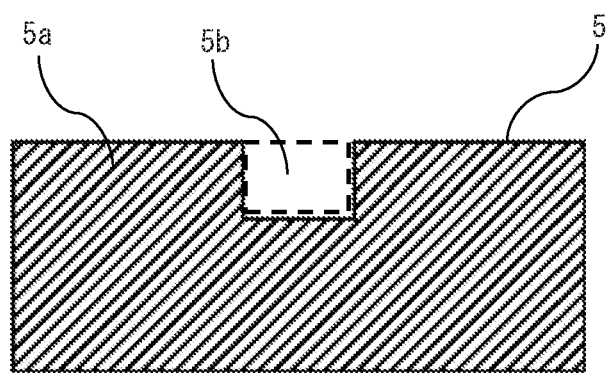
FIG. 4 is a plan view schematically showing a heat dissipation plate of the semiconductor device according to the first embodiment.
Figure 5:
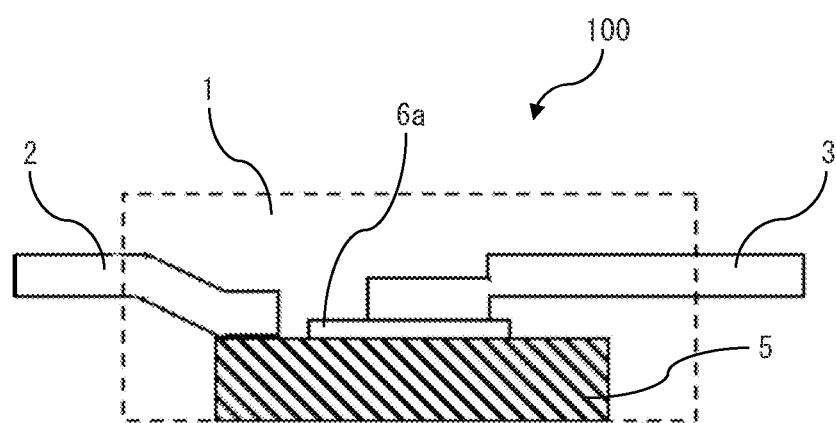
FIG. 5 is a sectional view schematically showing the semiconductor device, taken at an A-A cross-section position in FIG. 2.
Figure 6:
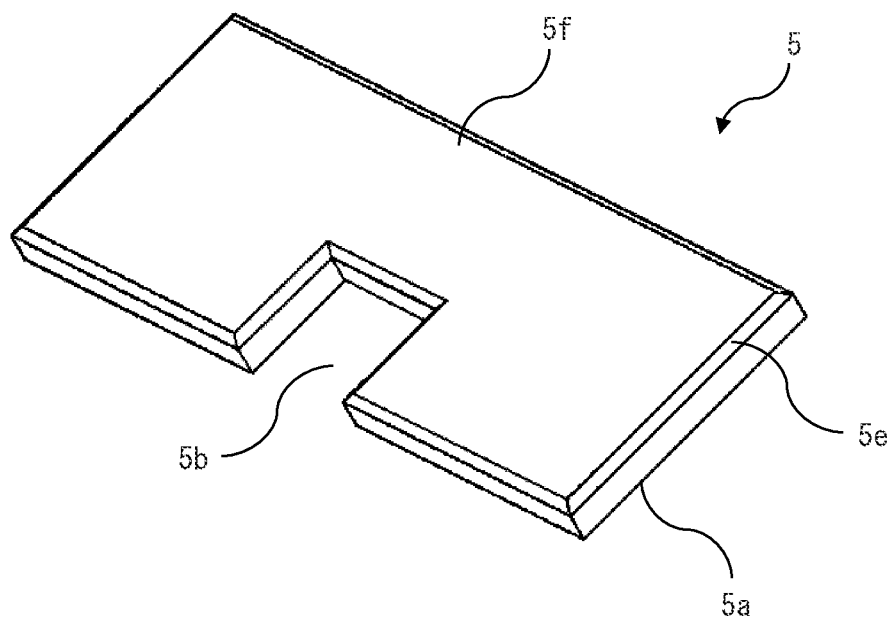
FIG. 6 is a perspective view showing the outer appearance of the heat dissipation plate of the semiconductor device according to the first embodiment.
Figure 7:
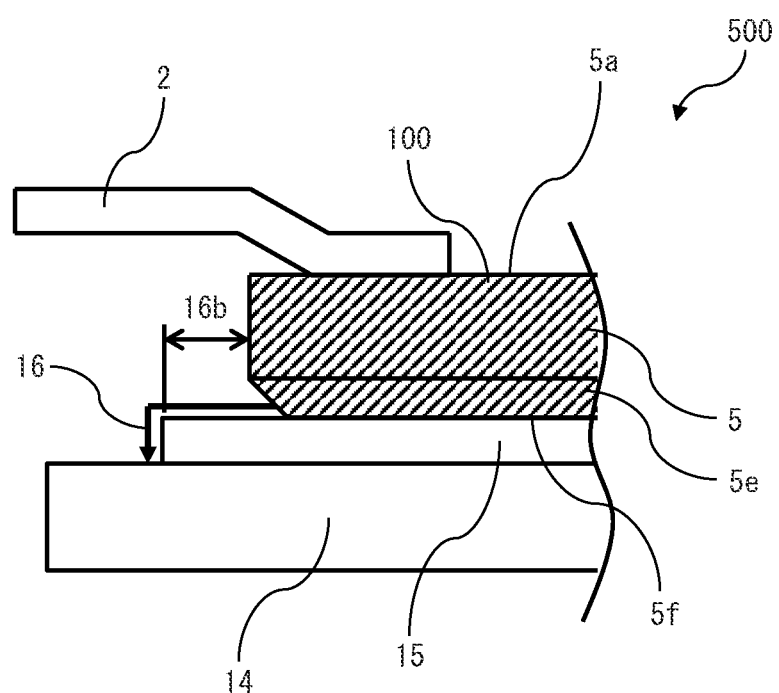
FIG. 7 is a sectional view schematically showing a specific part of the semiconductor device, taken at the A-A cross-section position in FIG. 2.
Figure 8:
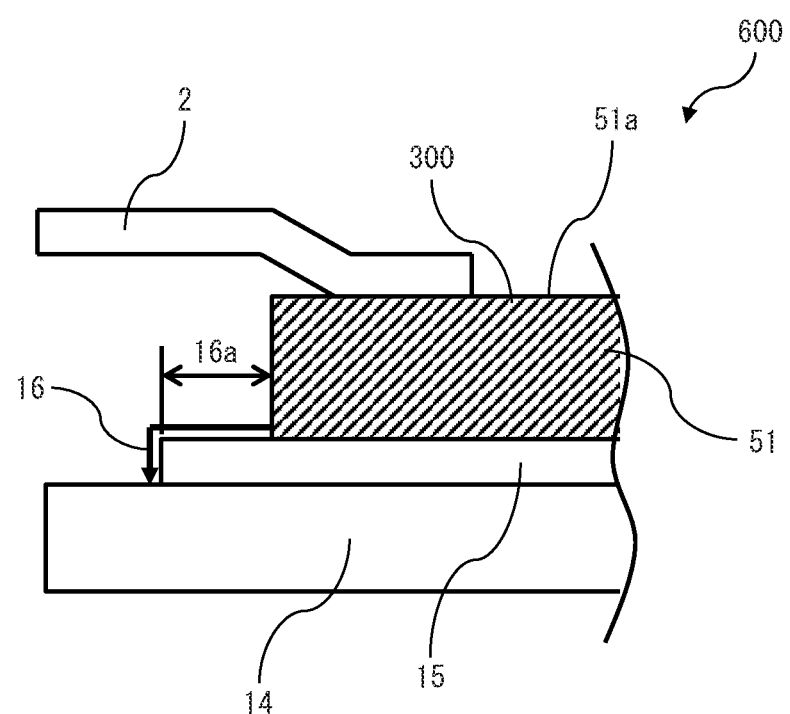
FIG. 8 is a sectional view showing a specific part of a semiconductor device in a comparative example.

FIG. 1 is a top view showing the outer appearance of a semiconductor module 500 according to the first embodiment of the present disclosure. FIG. 2 is a plan view schematically showing the structure of a semiconductor device 100. FIG. 3 is a side view showing the outer appearance of the semiconductor device 100. FIG. 4 is a plan view schematically showing a heat dissipation plate 5 of the semiconductor device 100, as seen from an element mounting surface 5a side. FIG. 5 is a sectional view schematically showing the semiconductor device 100 taken at an A-A cross-section position in FIG. 2, with a retracted portion 5e not shown. FIG. 6 is a perspective view showing the outer appearance of the heat dissipation plate 5 of the semiconductor device 100, as seen from a cooling surface 5f side opposite to the element mounting surface 5a. FIG. 7 is a sectional view schematically showing the semiconductor device 100 and members therearound, taken at the A-A cross-section position in FIG. 2, when a mold resin 1 which is a sealing member is removed. In FIG. 7, in particular, an area around a P terminal 2 and the heat dissipation plate 5 is shown in an enlarged manner. FIG. 8 is a sectional view showing a specific part of a semiconductor device 300 in a comparative example, and shows a part equivalent to FIG. 7. FIG. 2 shows a state in which the mold resin 1 is removed, and a broken line represents the outer shape of the mold resin 1. The semiconductor device 100 has a plurality of switching elements 6 and converts power through switching operation.

<Semiconductor Device 100>

As shown in FIG. 1, in the semiconductor device 100, P terminals 2 and an N terminal 3 which are main terminals, and control terminals 4 are provided so as to be exposed to the outside from the mold resin 1. In the present embodiment, the P terminals 2 and the control terminals 4 are exposed to the outside from the same side surface of the mold resin 1, and the N terminal 3 is exposed from the side surface on the side opposite to the side surface where the P terminals 2 and the control terminals 4 are exposed. The side surfaces where these terminals are exposed are not limited to the above surfaces. These terminals are terminals to be connected to external devices. In the present embodiment, the semiconductor device 100 has three control terminals 4. The three control terminals 4 are a gate terminal 4b which is a first terminal, a sense terminal 4c which is a second terminal, and a sense source terminal 4a. The mold resin 1 is provided in a rectangular parallelepiped shape. However, the shape of the mold resin 1 is not limited thereto. As shown in FIG. 3, the above terminals are exposed at the same height on the side surfaces of the mold resin 1. The terminals may be provided at different heights in accordance with terminal arrangements of external devices to be connected or the like.

As shown in FIG. 2, the semiconductor device 100 includes: the heat dissipation plate 5 formed in a plate shape; the plurality of switching elements 6, the P terminals 2, the N terminal 3, and the control terminals 4, which are joined to the element mounting surface 5a which is one surface of the heat dissipation plate 5; and the mold resin 1 sealing the plurality of switching elements 6, the heat dissipation plate 5, the P terminals 2, the N terminal 3, and the control terminals 4. In the present embodiment, the semiconductor device 100 is transfer-molded. However, without limitation thereto, a sealing member such as gel may be used. If sealing is made using gel, for example, a gel is injected into a resin case in which the switching elements 6 and the like are stored.

The heat dissipation plate 5 shown in FIG. 4 is formed in a rectangular shape from metal such as copper or aluminum which is high in thermal conductivity and is electrically conductive. The heat dissipation plate 5 is, for example, a heat spreader made of copper. The material and the shape of the heat dissipation plate 5 are not limited thereto. The heat dissipation plate 5 may be formed by another substrate material such as a direct bonded copper (DBC) substrate obtained by joining a ceramic insulated substrate which is an insulating material with a metal foil joined by brazing, to a copper base plate. The heat dissipation plate 5 and the switching elements 6 are electrically and thermally joined to each other by solder, for example. Means for joining between the heat dissipation plate 5 and the switching elements 6 is not limited to solder, and may be any material having such property that the thermal conductivity is high and the electric resistance is low, e.g., a paste material containing silver as a main component. Heat generated from the switching elements 6 is dissipated to the outside via the heat dissipation plate 5, whereby the switching elements 6 are effectively cooled. A cutout 5b and the retracted portion 5e (not shown in FIG. 4) provided to the heat dissipation plate 5 will be described later.

The switching elements 6 are composed of four switching elements 6a, 6b, 6c, 6d. The switching elements 6 may be power control semiconductor elements such as metal oxide semiconductor field effect transistors (MOSFET) or insulated gate bipolar transistors (IGBT), flyback diodes, or the like. Without limitation thereto, the switching elements 6 may be other switching elements such as bipolar transistors. In the present embodiment, MOSFETs are used and the parasitic diodes of the MOSFET are used as flyback diodes. However, in a case of, for example, using switching elements such as IGBTs not having parasitic diodes, flyback diodes may be added in parallel. The switching elements 6 are formed in a semiconductor substrate made of a material such as silicon carbide, silicon, or gallium nitride.

As shown in FIG. 2, the semiconductor device 100 has a sense element 8 located adjacently to a cutout 5b at the element mounting surface 5a of the heat dissipation plate 5. The sense element 8 is an element for measuring the temperature around the switching elements 6 via the heat dissipation plate 5. The sense element 8 measures the temperature around the switching elements 6, whereby temperature increase in the switching elements 6 can be suppressed. The sense element 8 is, for example, a thermistor. The sense element 8 is connected to the sense terminal 4c and the sense source terminal 4a via bonding wires 7c which are bonding members as second conductors.

<Terminals>

The P terminals 2, the N terminal 3, and the control terminals 4 are made of metal such as copper or aluminum having electric conductivity. One side of the P terminal 2 is joined to the element mounting surface 5a of the heat dissipation plate 5, and the other side thereof is exposed to the outside of the mold resin 1, to be connected to another device at the outside. One side of the N terminal 3 is joined to an electrode provided at a surface of each switching element 6 on the side opposite to the heat dissipation plate 5 side, and the other side of the N terminal 3 is exposed to the outside of the mold resin 1, to be connected to another device at the outside. The sense source terminal 4a is an extending part of the N terminal 3 extending to the side opposite to the side where the N terminal 3 is exposed to the outside from the main body of the N terminal 3. The sense source terminal 4a has the same potential as the N terminal 3. In the present embodiment, the sense source terminal 4a and the N terminal 3 are integrated with each other. However, the sense source terminal 4a and the N terminal 3 may be provided separately and connected to each other via a bonding wire or the like. In the present embodiment, parts of the P terminals 2 and the N terminal 3 that are connected inside the mold resin 1 are lowered to the connection side as shown in FIG. 5 so that parts of the P terminals 2 and the N terminal 3 that are exposed to the outside of the mold resin 1 are at the same height.

The gate terminal 4b is located apart from the heat dissipation plate 5 and extends in a direction away from the heat dissipation plate 5. The gate terminal 4b is connected to surfaces of the plurality of switching elements 6 on the side opposite to the heat dissipation plate 5 side, via a bonding wire 7a and a bonding wire 7b which are bonding members as first conductors. The connected parts of the switching elements 6 are gate electrodes 9 that the respective switching elements 6 have. The sense terminal 4c is located apart from the heat dissipation plate 5 and extends in a direction away from the heat dissipation plate 5. The sense terminal 4c is connected to the sense element 8 via the bonding wire 7c. The bonding wires 7a, 7b, 7c are made of aluminum, for example. However, without limitation thereto, other conductors such as copper ribbons may be used. In the case of using bonding members for either or both of the first conductors and the second conductors, the sectional areas of the conductors can be made smaller as compared to the DLB, and thus the semiconductor device 100 can be downsized.

The P terminal 2 joined to the element mounting surface 5a is connected to an electrode provided at a surface of each switching element 6 on the heat dissipation plate 5 side, via the heat dissipation plate 5. As described above, the N terminal 3 is connected to the electrode provided at the surface of each switching element 6 on the side opposite to the heat dissipation plate 5 side. With these connections, parallel connection is electrically made between the drain electrodes and between the source electrodes of the switching elements 6, thus forming a pair of arms.

<Semiconductor Module 500>

As shown in FIG. 1, the semiconductor module 500 includes the semiconductor device 100 and an insulating plate 15 which is a plate-shaped insulating member contacting with the other surface of the heat dissipation plate 5 excluding the retracted portion 5e described later. The insulating plate 15 is formed by resin, for example. The insulating member is not limited to the insulating plate 15, and may be an insulating sheet. In order to promote cooling of the switching elements 6, a cooler is attached to the cooling surface 5f (not shown in FIG. 1) which is a surface on the other side of the semiconductor device 100. Since the heat dissipation plate 5 is connected to the main electrodes of the switching elements 6, current flows through the heat dissipation plate 5. Therefore, the semiconductor module 500 is formed by the semiconductor device 100 and the insulating plate 15, and the semiconductor device 100 is attached to the cooler with the insulating plate 15 interposed therebetween. A predetermined creepage distance is provided between the semiconductor device 100 and the cooler.

<Cutout 5b>

As shown in FIG. 4, the cutout 5b is provided at an outer periphery of the heat dissipation plate 5. The cutout 5b is a part cut out inward from the outer periphery of the heat dissipation plate 5. In a case where the heat dissipation plate 5 is formed as shown in FIG. 4, the cutout 5b is an area enclosed by a broken line in FIG. 4. In the present embodiment, the cutout 5b is provided in a rectangular shape. However, the shape of the cutout 5b is not limited thereto, and the cutout 5b may be an area enclosed by a curved line. In a case of manufacturing the heat dissipation plate 5 by press work, the cutout 5b can be formed at the same time as the press work. The cutout 5b may be formed by removing a part of the heat dissipation plate 5 through cutting work or the like after manufacturing of the heat dissipation plate 5.

As shown in FIG. 2, a part of the gate terminal 4b on the heat dissipation plate 5 side overlaps the cut-out area at the cutout 5b as seen in the direction perpendicular to the element mounting surface 5a of the heat dissipation plate 5. A part of the sense terminal 4c on the heat dissipation plate 5 side overlaps the cut-out area at the cutout 5b as seen in the direction perpendicular to the element mounting surface 5a of the heat dissipation plate 5.

With this structure, the gate terminal 4b and the sense terminal 4c can be located inward of the outer periphery of the heat dissipation plate when the cutout 5b is assumed to be absent. Thus, it is possible to suppress size increase of the semiconductor device 100 in the direction in which the gate terminal 4b and the sense terminal 4c extend. In a wire bonding process, the gate terminal 4b and the sense terminal 4c can be supported by a jig in the area of the cutout 5b, and therefore it is not necessary to make support between the heat dissipation plate 5, and the gate terminal 4b and the sense terminal 4c. Since it is not necessary to use a new support member for making support between the heat dissipation plate 5, and the gate terminal 4b and the sense terminal 4c in the wire bonding process, the wire bonding process is not complicated. In addition, the gate terminal 4b and the sense terminal 4c can be easily placed on the same plane as the element mounting surface 5a. In addition, since the gate terminal 4b is located inward of the outer periphery of the heat dissipation plate when the cutout 5b is assumed to be absent, the current path length in the semiconductor device 100 is shortened, whereby increase in the circuit inductance of the semiconductor device 100 can be suppressed.

In addition, the volume of the heat dissipation plate 5 is reduced by the cutout 5b, and the mold resin 1 having a smaller density than the material used for the heat dissipation plate 5 fills the area of the cutout 5b. Thus, the weight of the semiconductor device 100 can be reduced. In addition, providing the cutout 5b can suppress warping due to a difference between the linear expansion coefficients of members. In addition, the contact area between the mold resin 1 and the heat dissipation plate 5 increases, so that adhesion between the mold resin 1 and the heat dissipation plate 5 can be improved.

Comparative Example

Prior to description of the retracted portion 5e which is a major part of the present disclosure, a comparative example will be described with reference to FIG. 8. FIG. 8 is a sectional view schematically showing the semiconductor device 300 and the members therearound, taken at a position equivalent to the A-A cross-section position in FIG. 2. In FIG. 8, in particular, an area around the P terminal 2 and a heat dissipation plate 51 is shown in an enlarged manner, with the mold resin 1 removed. Heat generated at a switching element (not shown in FIG. 8) joined to an element mounting surface 51a of the heat dissipation plate 51 is dissipated to the outside via the heat dissipation plate 51. In a case where the semiconductor device 300 is attached to a cooler 14 with the insulating plate 15 interposed therebetween, it is necessary to ensure a creepage distance 16 between the heat dissipation plate 51 and the cooler 14. The creepage distance 16 is a distance along an arrow shown in FIG. 8, and is the sum of the thickness of the insulating plate 15 and a horizontal distance 16a from a side surface part of the heat dissipation plate 51 that contacts with the insulating plate 15 to a side surface of the insulating plate 15. In order to ensure the creepage distance 16, the size of the insulating plate 15 with which the semiconductor device 300 contacts is increased in a direction away from the side surface of the heat dissipation plate 51, and thus the size of a semiconductor module 600 having the insulating plate 15 is increased.

<Retracted Portion 5e>

As shown in FIG. 6, the retracted portion 5e retracted inward is formed at the outer periphery of the cooling surface 5f of the heat dissipation plate 5. When the retracted portion 5e is formed, the area of the end surface of the cooling surface 5f is reduced toward the inner side of the cooling surface 5f. In the present embodiment, the retracted portion 5e is a chamfer portion chamfered along the outer periphery of the cooling surface 5f. As shown in FIG. 7, when the retracted portion 5e is formed, a horizontal distance 16b of the creepage distance 16 can be made smaller than the horizontal distance 16a when the retracted portion 5e is not formed as shown in FIG. 8. Since the horizontal distance 16b is made small, size increase of the insulating plate 15 with which the semiconductor device 100 contacts, in the direction away from the side surface of the heat dissipation plate 5, can be suppressed. Since size increase of the insulating plate 15 is suppressed, size increase of the semiconductor module 600 having the insulating plate 15 can be suppressed.

The chamfer portion is formed by pressing the outer periphery of the cooling surface 5f of the heat dissipation plate 5 by a die, for example. In the present embodiment, the chamfer portion is formed as the retracted portion 5e. However, the shape of the retracted portion 5e is not limited thereto. In the case of forming the retracted portion 5e by the chamfer portion, the retracted portion 5e can be easily formed. Since the retracted portion 5e is easily formed, productivity of the semiconductor device 100 can be improved.

<Arrangement of Switching Elements 6>

As shown in FIG. 2, the plurality of switching elements 6 are arranged in a line with the cutout 5b interposed therebetween, in respective areas on both sides of the cutout 5b on the element mounting surface 5a of the heat dissipation plate 5. In the present embodiment, the plurality of switching elements 6 are arranged in a line along the long side of the rectangular heat dissipation plate 5. The switching elements 6a, 6b are arranged in the area on one side of the cutout 5b on the element mounting surface 5a of the heat dissipation plate 5, and the switching elements 6c, 6d are arranged in the area on the other side. With this structure, the switching elements 6 are arranged separately in the respective areas on one side and the other side of the cutout 5b, and thus the switching elements 6 arranged in the respective different areas are less likely to thermally interfere with each other. Since the switching elements 6 arranged in the respective different areas are less likely to thermally interfere with each other, heat dissipation property of the switching elements 6 can be improved.

Parts of the gate terminal 4b to which the bonding wire 7a and the bonding wire 7b are connected, and the gate electrodes 9, are arranged in a line in a direction parallel to the element mounting surface 5a of the heat dissipation plate 5. With this structure, the plurality of switching elements 6 can be arranged closely, whereby the lengths of the bonding wire 7a and the bonding wire 7b can be shortened. Since the lengths of the bonding wire 7a and the bonding wire 7b can be shortened, productivity of the semiconductor device 100 can be improved.

In each of the areas on one side and the other side of the cutout 5b on the element mounting surface 5a of the heat dissipation plate 5, the gate electrodes 9 of the two switching elements 6 adjacent to each other are connected via the bonding wire 7a or the bonding wire 7b. The gate electrode 9 of one switching element 6b present in the area on one side and adjacent to the cutout 5b, and the gate terminal 4b, are connected via the bonding wire 7a. The gate electrode 9 of one switching element 6c present in the area on the other side and adjacent to the cutout 5b, and the gate terminal 4b, are connected via the bonding wire 7b. In the present embodiment, an example in which the respective gate electrodes 9 are connected in parallel to the gate terminal 4b by stitch bonding as described above, is shown. The bonding wire 7a is a stitch wire connecting the gate terminal 4b and the switching elements 6a, 6b provided in the area on one side. The bonding wire 7b is a stitch wire connecting the gate terminal 4b and the switching elements 6c, 6d provided in the area on the other side.

With this structure, the gate terminal 4b connected to the plurality of switching elements 6 can be located in the area of the cutout 5b closely to the plurality of switching elements 6. Since the gate terminal 4b can be located in the area of the cutout 5b closely to the plurality of switching elements 6, the semiconductor device 100 can be downsized. In addition, the bonding wires 7a, 7b extend approximately straightly along the direction in which the switching elements 6 are arranged, and thus are provided in a low-loop short-wire arrangement. Therefore, short-circuit failure, which could be caused by deformation of the bonding wires 7a, 7b in a resin sealing process, hardly occurs, and thus productivity of the semiconductor device 100 can be improved. In the present embodiment, the example in which the respective gate electrodes 9 are connected in parallel to the gate terminal 4b by stitch bonding has been shown. However, without limitation thereto, the gate electrodes 9 and the gate terminal 4b may be connected by different wires.

The switching elements 6a, 6b provided in the area on one side and the switching elements 6c, 6d provided in the area on the other side are arranged to be line-symmetric with respect to a first reference line X perpendicular to the direction in which the switching elements 6 are arranged as seen in the direction perpendicular to the element mounting surface 5a of the heat dissipation plate 5. With this structure, the lengths of the bonding wires 7a, 7b are made equal to each other, whereby variations in control signals due to wire lengths can be suppressed.

In the present embodiment, two switching elements 6 are arranged in each of the areas on one side and the other side. However, the number of arranged switching elements 6 is not limited thereto. One switching element 6 or three or more switching elements 6 may be arranged in each area. In addition, although four switching elements 6 are connected in parallel per one arm, the number of switching elements 6 connected in parallel is not limited to four. In addition, although the gate electrodes 9 of the plurality of switching elements 6 are connected to one gate terminal 4b, a plurality of gate terminals 4b may be provided and each gate terminal 4b may be connected to any corresponding gate electrode 9.

As described above, in the semiconductor device 100 according to the first embodiment, the gate terminal 4b is located apart from the plate-shaped heat dissipation plate 5 and extends in the direction away from the heat dissipation plate 5. The gate terminal 4b is connected to the surfaces of the plurality of switching elements 6 on the side opposite to the heat dissipation plate 5 side, via the first conductors. The cutout 5b is provided at the outer periphery of the heat dissipation plate 5. The part of the gate terminal 4b on the heat dissipation plate 5 side overlaps the cut-out area at the cutout 5b, as seen in the direction perpendicular to the element mounting surface 5a of the heat dissipation plate 5. Therefore, without using a new support member in the wire bonding process, the gate terminal 4b can be placed inward of the outer periphery of the heat dissipation plate 5 when the cutout 5b is assumed to be absent. Thus, without complication of the wire bonding process, size increase of the semiconductor device 100 in the direction in which the gate terminal 4b extends can be suppressed.

The retracted portion 5e retracted inward is formed at the outer periphery of the cooling surface 5f of the heat dissipation plate 5. Thus, the horizontal distance 16b of the creepage distance 16 can be made smaller than the horizontal distance 16a when the retracted portion 5e is not formed, whereby size increase of the insulating plate 15 with which the semiconductor device 100 contacts can be suppressed. In addition, since size increase of the insulating plate 15 is suppressed, size increase of the semiconductor module 600 having the insulating plate 15 can be suppressed. In the case where the retracted portion 5e is a chamfer portion chamfered along the outer periphery of the cooling surface 5f, the retracted portion 5e can be easily formed. Since the retracted portion 5e can be easily formed, productivity of the semiconductor device 100 can be improved.

Second Embodiment

Figure 9:
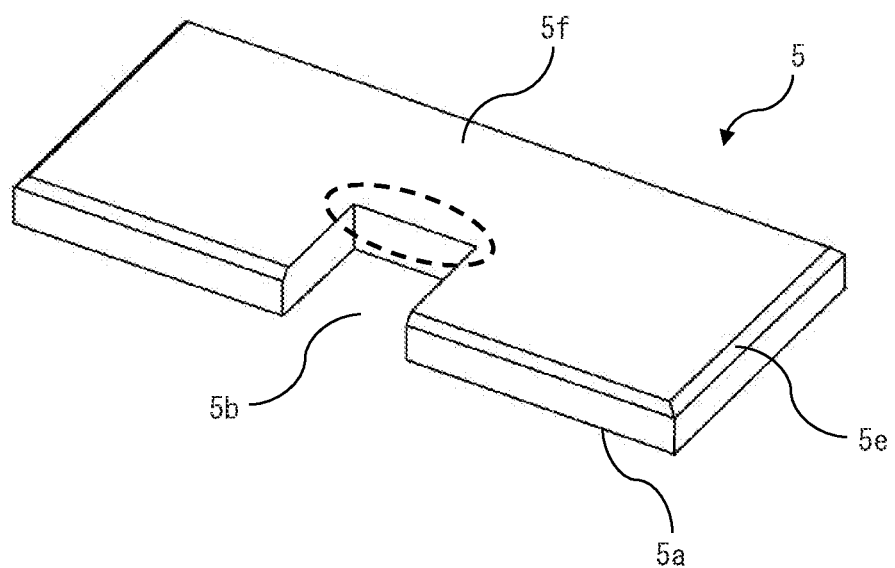
FIG. 9 is a perspective view showing the outer appearance of a heat dissipation plate of a semiconductor device according to the second embodiment of the present disclosure.

A semiconductor device 100 according to the second embodiment of the present disclosure will be described. FIG. 9 is a perspective view showing the outer appearance of the heat dissipation plate 5 of the semiconductor device 100 according to the second embodiment, as seen from the cooling surface 5f side opposite to the element mounting surface 5a. The semiconductor device 100 according to the second embodiment is different from the first embodiment in the part where the retracted portion 5e is formed.

The retracted portion 5e is formed at the outer periphery of the cooling surface 5f of the heat dissipation plate 5 excluding the part at the cutout 5b. The retracted portion 5e is a chamfer portion chamfered along the outer periphery of the cooling surface 5f. In the case of the shape of the heat dissipation plate 5 according to the first embodiment, when sealing with the mold resin 1 is performed to form the semiconductor device 100, gas might be stored at, in particular, the retracted portion 5e positioned on the deep side of the cutout 5b (part enclosed by a broken line in FIG. 9) and around the retracted portion 5e at this part. If the gas is stored, fluidity of the mold resin 1 is inhibited and thus a part that is not sealed with the mold resin 1 might be formed in the semiconductor device 100.

As described above, in the semiconductor device 100 according to the second embodiment, the retracted portion 5e is formed at the outer periphery of the cooling surface 5f of the heat dissipation plate 5 excluding the part at the cutout 5b, that is, the retracted portion 5e is not formed at the cutout 5b. Therefore, when sealing with the mold resin 1 is performed to form the semiconductor device 100, gas is not stored at the retracted portion 5e at the cutout 5b and around the retracted portion 5e at this part, so that fluidity of the mold resin 1 can be improved. Since the fluidity of the mold resin 1 is improved, such a part that is not sealed with the mold resin 1 can be prevented from being formed in the semiconductor device 100.

Third Embodiment

Figure 10:
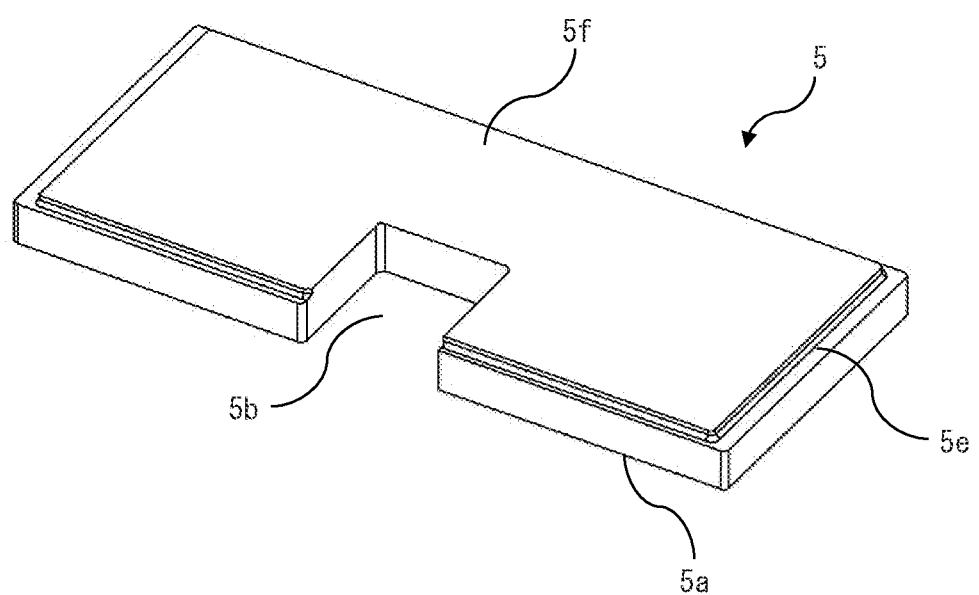
FIG. 10 is a perspective view showing the outer appearance of a heat dissipation plate of a semiconductor device according to the third embodiment of the present disclosure.
Figure 11:
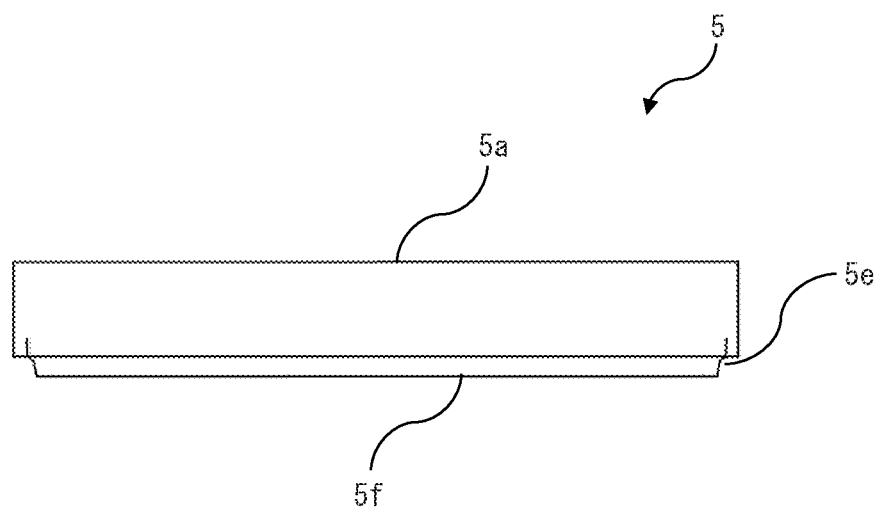
FIG. 11 is a side view showing the outer appearance of the heat dissipation plate of the semiconductor device according to the third embodiment.

A semiconductor device 100 according to the third embodiment of the present disclosure will be described. FIG. 10 is a perspective view showing the outer appearance of the heat dissipation plate 5 of the semiconductor device 100 according to the third embodiment, as seen from the cooling surface 5f side opposite to the element mounting surface 5a. FIG. 11 is a side view showing the outer appearance of the heat dissipation plate 5 of the semiconductor device 100. The semiconductor device 100 according to the third embodiment is different from the second embodiment in the shape of the retracted portion 5e.

The retracted portion 5e is formed by a step where the outer periphery of the cooling surface 5f of the heat dissipation plate 5 is retracted to the element mounting surface 5a side of the heat dissipation plate 5. The retracted portion 5e is formed at the outer periphery of the cooling surface 5f of the heat dissipation plate 5 excluding the part at the cutout 5b. The step is formed by pressing the outer periphery of the cooling surface 5f of the heat dissipation plate 5 by a die, for example. The chamfer portion shown in the second embodiment and the step shown in the present embodiment can both be formed by the same manufacturing method. The step is formed by pressing the outer periphery of the cooling surface 5f perpendicularly by a flat part of the die, and therefore is easily formed with high dimensional accuracy. On the other hand, the chamfer portion is formed by pressing the outer periphery of the cooling surface 5f by an oblique surface of the die, and therefore the dimensional accuracy is likely to be lowered.

As described above, in the semiconductor device 100 according to the third embodiment, the retracted portion 5e is formed by the step where the outer periphery of the cooling surface 5f of the heat dissipation plate 5 is retracted to the element mounting surface 5a side of the heat dissipation plate 5. Therefore, the retracted portion 5e can be formed with high dimensional accuracy. Since the retracted portion 5e is formed with high dimensional accuracy, the creepage distance 16 between the heat dissipation plate 5 and the cooler 14 can be stably ensured. Since the creepage distance 16 is stably ensured, reliability of the semiconductor device 100 can be improved.

Fourth Embodiment

Figure 12:
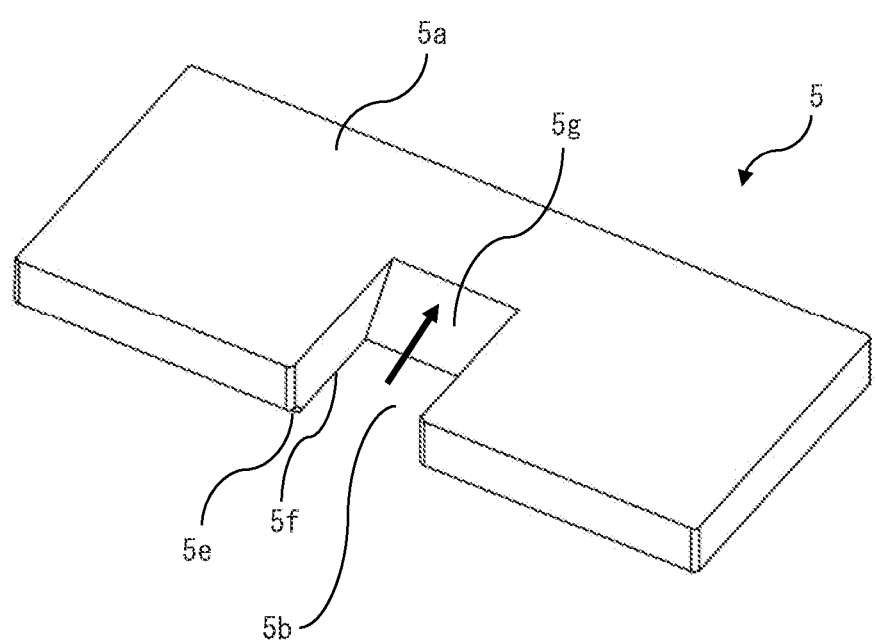
FIG. 12 is a perspective view showing the outer appearance of a heat dissipation plate of a semiconductor device according to the fourth embodiment of the present disclosure.

A semiconductor device 100 according to the fourth embodiment of the present disclosure will be described. FIG. 12 is a perspective view showing the outer appearance of the heat dissipation plate 5 of the semiconductor device 100 according to the fourth embodiment, as seen from the element mounting surface 5a side. The semiconductor device 100 according to the fourth embodiment is different from the third embodiment in the shape of a part of the heat dissipation plate 5 that is positioned on the deep side of the cutout 5b.

Figure 13:
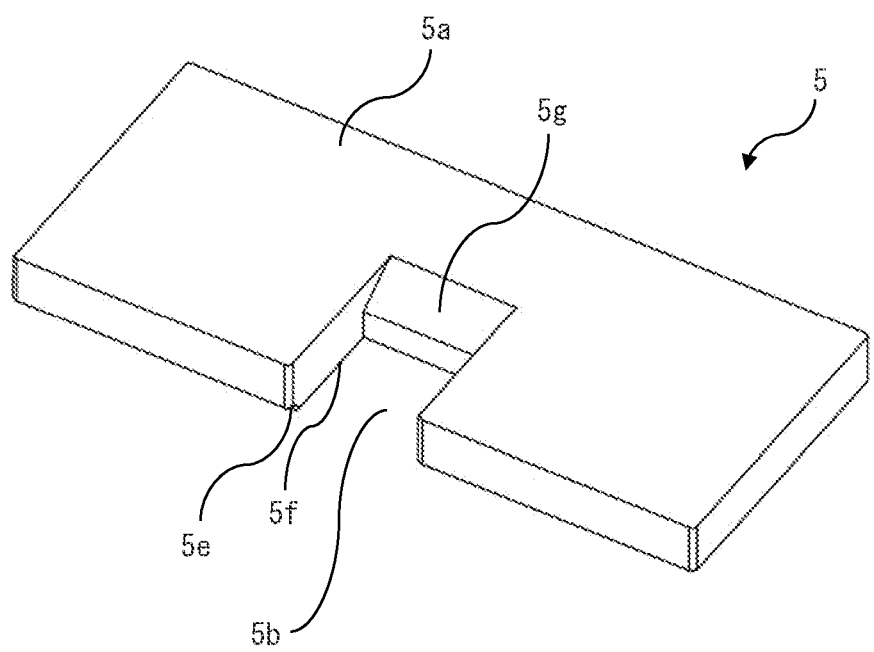
FIG. 13 is a perspective view showing the outer appearance of another heat dissipation plate of the semiconductor device according to the fourth embodiment.

At a deep-side part which is a part of the heat dissipation plate 5 positioned on the deep side of the cutout 5b, a deep-side retracted portion 5g retracted inward is formed on the element mounting surface 5a of the heat dissipation plate 5 at the deep-side part. The deep-side retracted portion 5g in the present embodiment is formed by a slope surface formed on the surface on the cutout 5b side at the deep-side part. The slope surface is gradually sloped from the cutout 5b side to the heat dissipation plate 5 side, as approaching toward the element mounting surface 5a from the cooling surface 5f of the heat dissipation plate 5. The slope angle of the slope surface is not limited to the angle shown in FIG. 12, and may be a smaller angle, for example. Alternatively, as shown in a modification in FIG. 13, the slope surface may not be formed from the cooling surface 5f side. FIG. 13 is a perspective view showing the outer appearance of another heat dissipation plate 5 of the semiconductor device 100 according to the fourth embodiment, as seen from the element mounting surface 5a side.

As described above, in the semiconductor device 100 according to the fourth embodiment, at the deep-side part which is the part of the heat dissipation plate 5 positioned on the deep side of the cutout 5b, the deep-side retracted portion 5g retracted inward is formed on the element mounting surface 5a of the heat dissipation plate 5 at the deep-side part. Thus, fluidity of the mold resin 1 in the arrow direction shown in FIG. 12 can be improved. The deep-side retracted portion 5g may be formed by the slope surface formed on the surface on the cutout 5b side at the deep-side part, and the slope surface may be gradually sloped from the cutout 5b side to the heat dissipation plate 5 side, as approaching toward the element mounting surface 5a from the cooling surface 5f of the heat dissipation plate 5. In this case, the mold resin 1 flows along the slope surface and thus fluidity of the mold resin 1 in the arrow direction shown in FIG. 12 can be improved.

Fifth Embodiment

Figure 14:
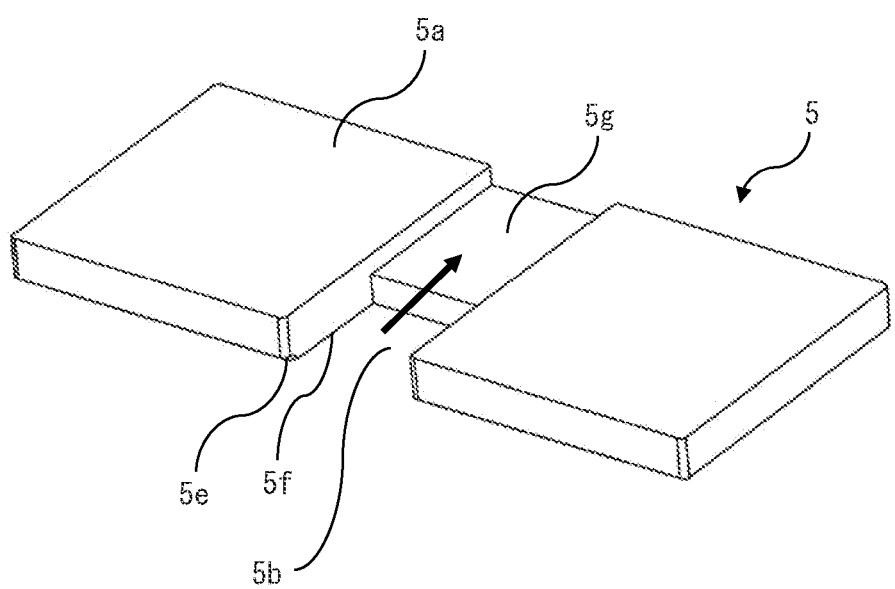
FIG. 14 is a perspective view showing the outer appearance of a heat dissipation plate of a semiconductor device according to the fifth embodiment of the present disclosure.

A semiconductor device 100 according to the fifth embodiment of the present disclosure will be described. FIG. 14 is a perspective view showing the outer appearance of the heat dissipation plate 5 of the semiconductor device 100 according to the fifth embodiment, as seen from the element mounting surface 5a side. The semiconductor device 100 according to the fifth embodiment is different from the fourth embodiment in the shape of the deep-side retracted portion 5g.

The deep-side retracted portion 5g is formed by a step where the element mounting surface 5a of the heat dissipation plate 5 at the deep-side part positioned on the deep side of the cutout 5b is retracted to the cooling surface 5f side of the heat dissipation plate 5. The step is provided by forming the heat dissipation plate 5 such that the side surface where the cutout 5b is provided and the side surface on the side opposite to the side surface where the cutout 5b is provided communicate with each other.

As described above, in the semiconductor device 100 according to the fifth embodiment, the deep-side retracted portion 5g is formed by the step where the element mounting surface 5a of the heat dissipation plate 5 at the deep-side part is retracted to the cooling surface 5f side of the heat dissipation plate 5, so that the part where the mold resin 1 flows in the arrow direction shown in FIG. 14 is expanded. Thus, fluidity of the mold resin 1 in the arrow direction can be further improved.

Sixth Embodiment

Figure 15:
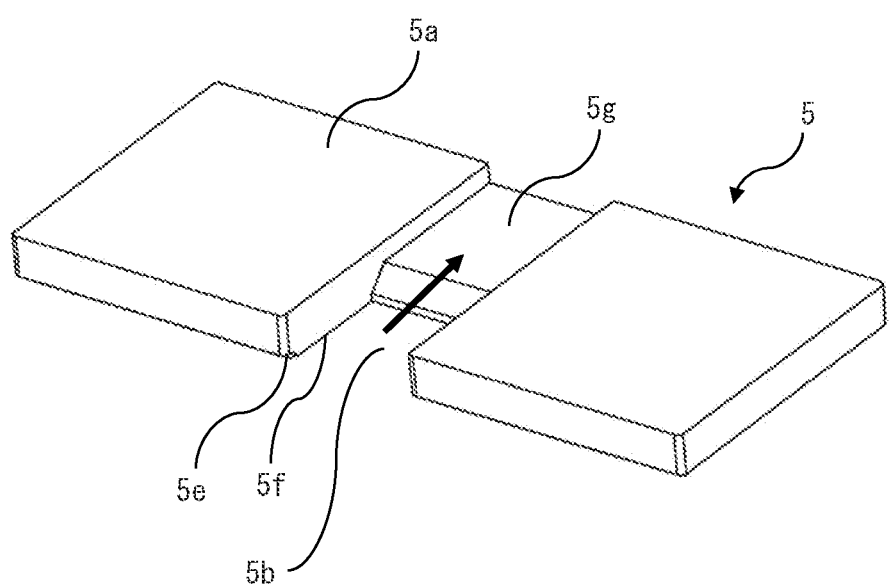
FIG. 15 is a perspective view showing the outer appearance of a heat dissipation plate of a semiconductor device according to the sixth embodiment of the present disclosure.

A semiconductor device 100 according to the sixth embodiment of the present disclosure will be described. FIG. 15 is a perspective view showing the outer appearance of the heat dissipation plate 5 of the semiconductor device 100 according to the sixth embodiment, as seen from the element mounting surface 5a side. The semiconductor device 100 according to the sixth embodiment is different from the fifth embodiment in the shape of the deep-side retracted portion 5g.

The deep-side retracted portion 5g is formed by a slope surface formed on the surface on the cutout 5b side at the deep-side part positioned on the deep side of the cutout 5b, and a step where the element mounting surface 5a of the heat dissipation plate 5 at the deep-side part is retracted to the cooling surface 5f side of the heat dissipation plate 5. The step is provided by forming the heat dissipation plate 5 such that the side surface where the cutout 5b is provided and the side surface on the side opposite to the side surface where the cutout 5b is provided communicate with each other.

As described above, in the semiconductor device 100 according to the sixth embodiment, the deep-side retracted portion 5g is formed by the slope surface and the step. Thus, the mold resin 1 flows along the slope surface, so that fluidity of the mold resin 1 in the arrow direction shown in FIG. 15 is improved, and the part where the mold resin 1 flows in the arrow direction shown in FIG. 15 is expanded owing to the step, whereby fluidity of the mold resin 1 in the arrow direction can be further improved.

Seventh Embodiment

Figure 16:
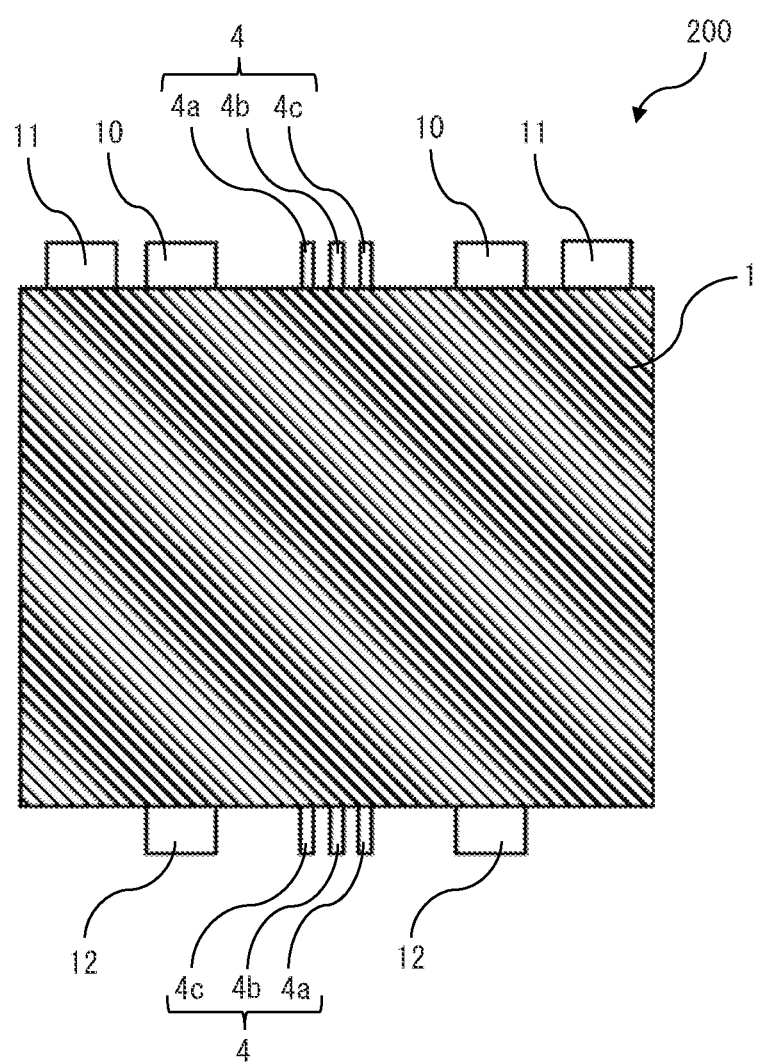
FIG. 16 is a top view showing the outer appearance of a semiconductor device according to the seventh embodiment of the present disclosure.
Figure 17:
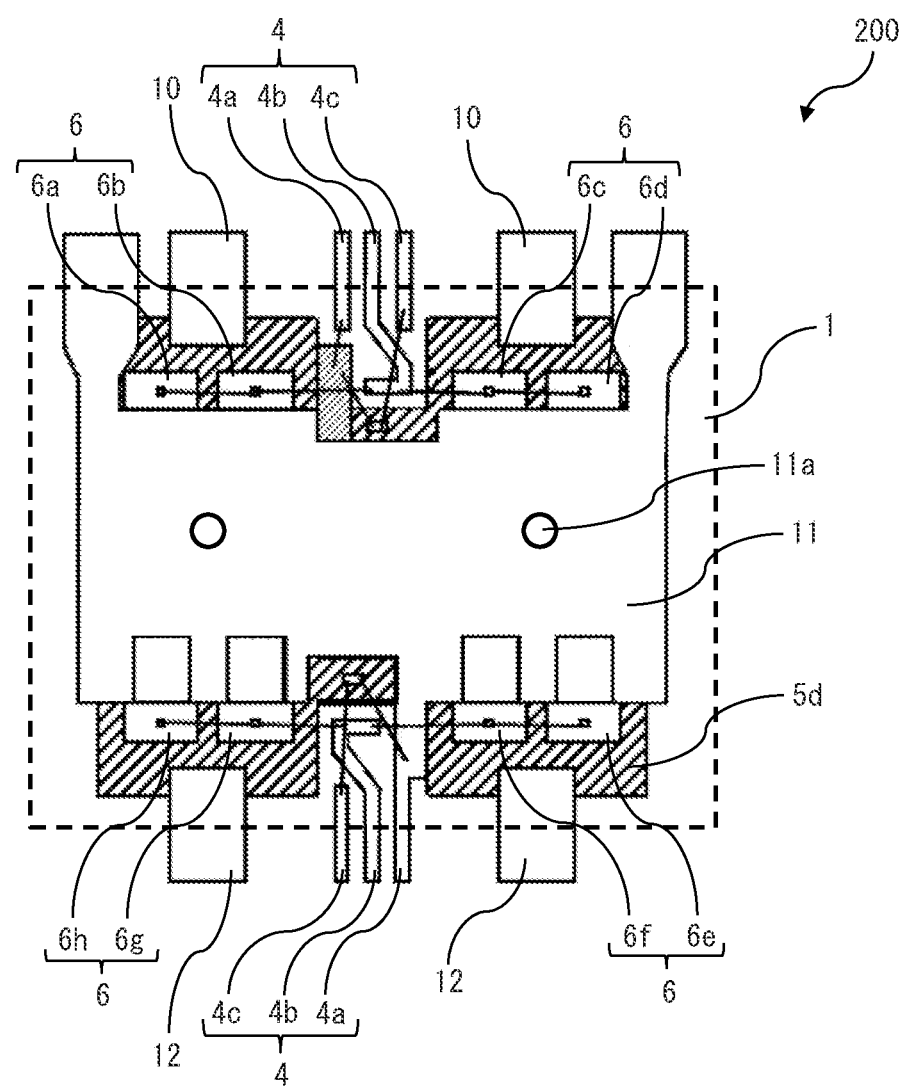
FIG. 17 is a plan view schematically showing the structure of the semiconductor device according to the seventh embodiment.
Figure 18:
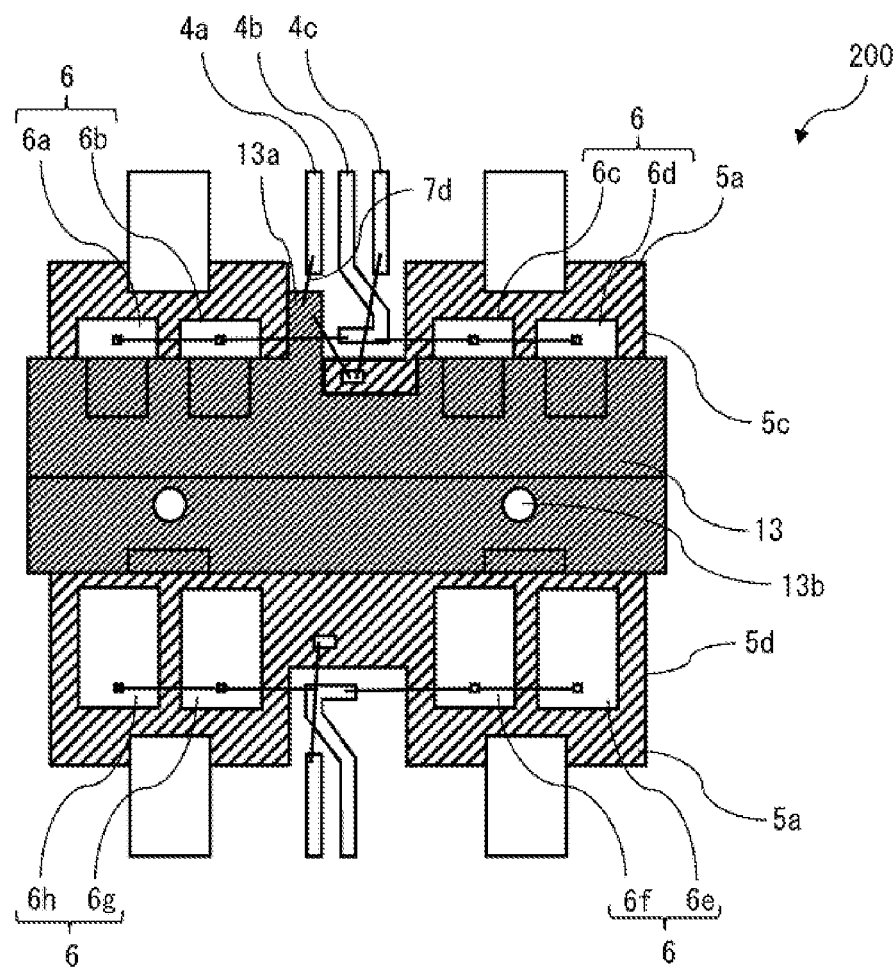
FIG. 18 is another plan view schematically showing the structure of the semiconductor device according to the seventh embodiment.
Figure 19:
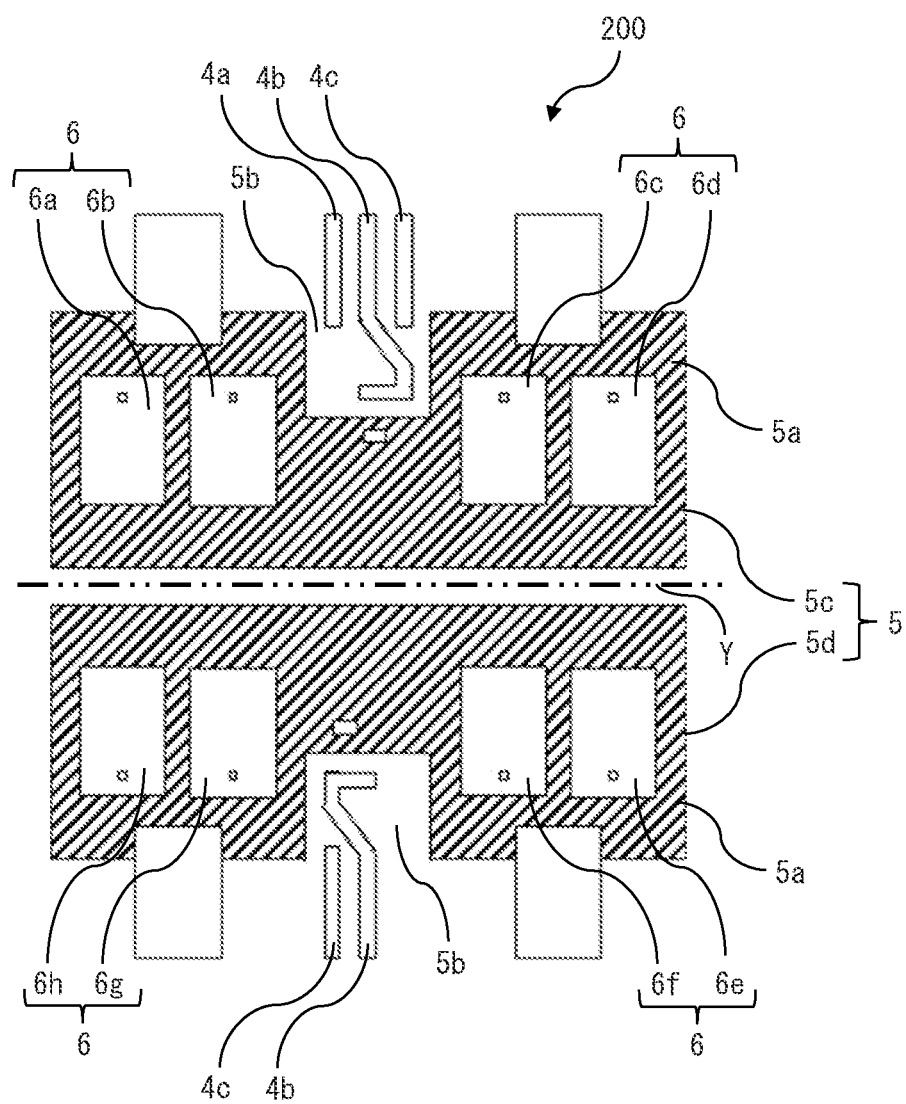
FIG. 19 is still another plan view schematically showing the structure of the semiconductor device according to the seventh embodiment.
Figure 20:
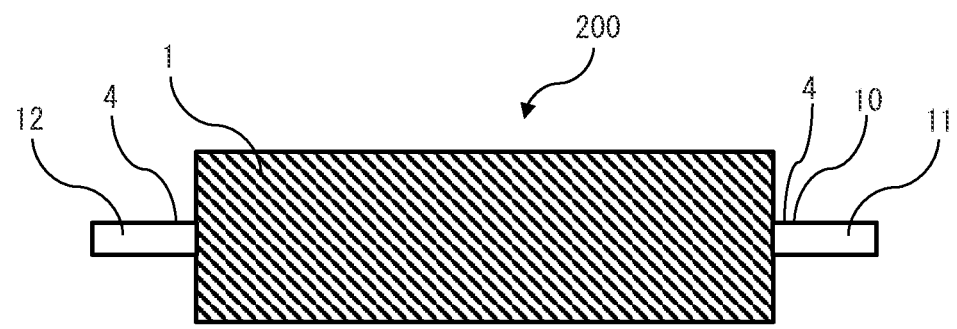
FIG. 20 is a side view showing the outer appearance of the semiconductor device according to the seventh embodiment.
Figure 21:
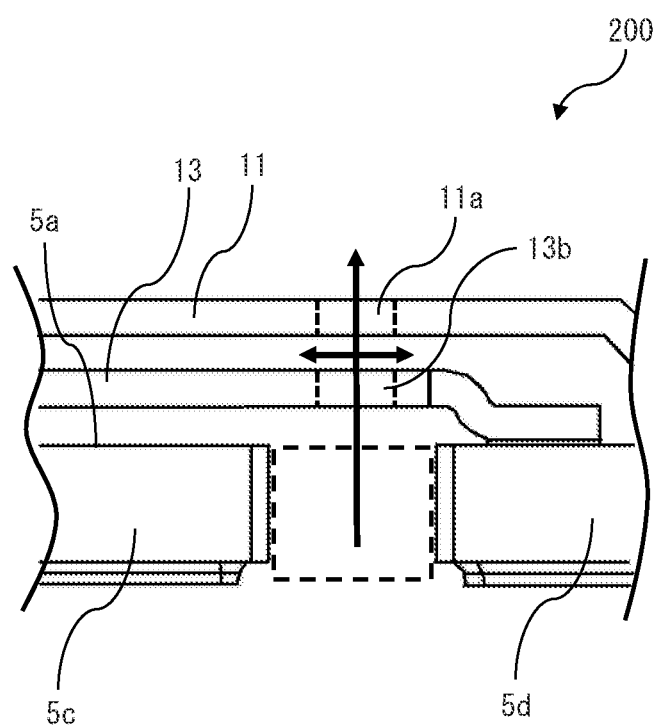
FIG. 21 is a side view showing a specific part of the semiconductor device according to the seventh embodiment.

A semiconductor device 200 according to the seventh embodiment of the present disclosure will be described. FIG. 16 is a top view showing the outer appearance of the semiconductor device 200 according to the seventh embodiment. FIG. 17 is a plan view schematically showing the structure of the semiconductor device 200, with the mold resin 1 removed. FIG. 18 is a plan view schematically showing the structure of the semiconductor device 200, with a negative-arm N terminal 11 removed from FIG. 17. FIG. 19 is a plan view schematically showing the structure of the semiconductor device 200, with an inner lead 13 removed from FIG. 18. FIG. 20 is a side view showing the outer appearance of the semiconductor device 200. FIG. 21 is a side view showing a specific part of the semiconductor device 200, with the mold resin 1 removed. A broken line shown in FIG. 17 represents the outer shape of the mold resin 1. The semiconductor device 200 according to the seventh embodiment is configured to include two sets of pluralities of the switching elements 6, the heat dissipation plates 5, the gate terminals 4b, and the sense terminals 4c.

<Semiconductor Device 200>

The semiconductor device 200 includes positive and negative arms formed by the switching elements 6. The positive arm and the negative arm are connected in series. The positive arm and the negative arm are integrally molded with the mold resin 1. This structure is generally called a 2-in-1 module. Although the 2-in-1 structure is described in the present embodiment, the semiconductor device 200 may have a 4-in-1 structure or a 6-in-1 structure.

As shown in FIG. 16, in the semiconductor device 200, positive-arm P terminals 10, the negative-arm N terminal 11, and AC terminals 12 which are main terminals, and the control terminals 4, are provided so as to be exposed to the outside from the mold resin 1. In the present embodiment, the positive-arm P terminals 10 and the negative-arm N terminal 11 are exposed to the outside from the same side surface of the mold resin 1, and the AC terminals 12 are exposed from the side surface on the side opposite to the side surface where the positive-arm P terminals 10 and the negative-arm N terminal 11 are exposed. The control terminals 4 are provided at both side surfaces. The side surfaces where these terminals are exposed are not limited to the above surfaces. These terminals are terminals to be connected to external devices. As shown in FIG. 20, these terminals are exposed at the same height on the side surfaces of the mold resin 1. The terminals may be provided at different heights in accordance with terminal arrangements of external devices to be connected or the like.

As shown in FIG. 19, the semiconductor device 200 includes two sets of the pluralities of switching elements 6, the heat dissipation plates 5, the gate terminals 4b, and the sense terminals 4c. In FIG. 19, the upper side is the positive-arm side and is defined as first set, and the lower side is the negative-arm side and is defined as second set. A heat dissipation plate 5c in the first set and a heat dissipation plate 5d in the second set are arranged adjacently on the same plane. In the present embodiment, the heat dissipation plate 5c in the first set and the heat dissipation plate 5d in the second set are formed in rectangular shapes, their long sides are opposed to each other, and the heat dissipation plate 5c in the first set, the heat dissipation plate 5d in the second set, and the pluralities of switching elements 6 in both sets are arranged to be line-symmetric with respect to a second reference line Y along the long sides. Switching elements 6a, 6b, 6c, 6d are joined to the heat dissipation plate 5c in the first set, and switching elements 6e, 6f, 6g, 6h are joined to the heat dissipation plate 5d in the second set. The cutout 5b of the heat dissipation plate 5c in the first set is provided at the outer periphery of the heat dissipation plate 5c in the first set on the side opposite to the heat dissipation plate 5d in the second set. The cutout 5b of the heat dissipation plate 5d in the second set is provided at the outer periphery of the heat dissipation plate 5d in the second set on the side opposite to the heat dissipation plate 5c in the first set. The gate terminal 4b and the sense terminal 4c in the first set extend to the side opposite to the heat dissipation plate 5d in the second set. The gate terminal 4b and the sense terminal 4c in the second set extend to the side opposite to the heat dissipation plate 5c in the first set.

Parts of the gate terminal 4b on the heat dissipation plate 5c side in the first set and the heat dissipation plate 5d side in the second set respectively overlap the cut-out areas at the cutouts 5b as seen in the direction perpendicular to the element mounting surfaces 5a of the heat dissipation plate 5c in the first set and the heat dissipation plate 5d in the second set. Parts of the sense terminals 4c on the heat dissipation plate 5c side in the first set and the heat dissipation plate 5d side in the second set respectively overlap the cut-out areas at the cutouts 5b as seen in the direction perpendicular to the element mounting surfaces 5a of the heat dissipation plate 5c in the first set and the heat dissipation plate 5d in the second set.

With this structure, the cutouts 5b can be formed in both the heat dissipation plate 5c in the first set and the heat dissipation plate 5d in the second set arranged adjacently on the same plane. Thus, size increase of the semiconductor device 200 in the directions in which the gate terminals 4b and the sense terminals 4c extend can be suppressed. In addition, since each gate terminal 4b is located inward of the outer periphery of the heat dissipation plate when the cutout 5b is assumed to be absent, the current path length in the semiconductor device 200 is shortened, whereby increase in the circuit inductance of the semiconductor device 200 can be suppressed.

<Inner Lead 13>

As shown in FIG. 18, the semiconductor device 200 includes the inner lead 13 and the sense source terminal 4a which is a third terminal. The inner lead 13 connects the element mounting surface 5a of the heat dissipation plate 5d in the second set, and the electrodes provided at the surfaces, of the switching elements 6a, 6b, 6c, 6d joined to the element mounting surface 5a of the heat dissipation plate 5c in the first set, that are on the side opposite to the heat dissipation plate 5c side in the first set. The inner lead 13 has an extending portion 13a extending from the body part toward the side opposite to the heat dissipation plate 5d in the second set. The sense source terminal 4a is located apart from the heat dissipation plate 5c in the first set and extends in a direction away from the heat dissipation plate 5c in the first set. The element mounting surface 5a of the heat dissipation plate 5d in the second set is joined to the electrodes provided at the surfaces of the switching elements 6e, 6f, 6g, 6h on the heat dissipation plate 5d side in the second set. A part of the sense source terminal 4a on the heat dissipation plate 5c side in the first set, and the extending portion 13a, are located to overlap the area of the cutout 5b of the heat dissipation plate 5c in the first set as seen in the direction perpendicular to the element mounting surface 5a of the heat dissipation plate 5c in the first set, and the extending portion 13a is connected to the sense source terminal 4a via a bonding wire 7d which is a bonding member as a third conductor. In the case of using a bonding member for the third conductor, the sectional area of the conductor can be made smaller as compared to the DLB, and thus the semiconductor device 200 can be downsized.

With this structure, the sense source terminal 4a and the extending portion 13a can be located inward of the outer periphery of the heat dissipation plate when the cutout 5b is assumed to be absent. Thus, it is possible to suppress size increase of the semiconductor device 200 in the direction in which the sense source terminal 4a and the extending portion 13a extend. In the wire bonding process, the sense source terminal 4a and the extending portion 13a can be supported by a jig in the area of the cutout 5b, and therefore it is not necessary to make support between the heat dissipation plate 5, and the sense source terminal 4a and the extending portion 13a. Since it is not necessary to use a new support member for making support between the heat dissipation plate 5, and the sense source terminal 4a and the extending portion 13a in the wire bonding process, the wire bonding process is not complicated. In addition, since the sense source terminal 4a is located inward of the outer periphery of the heat dissipation plate when the cutout 5b is assumed to be absent, the current path length in the semiconductor device 200 is shortened, whereby increase in the circuit inductance of the semiconductor device 200 can be suppressed.

<Arm Structure in Semiconductor Device 200>

The positive and negative arms of the semiconductor device 200 will be described. As shown in FIG. 18, the switching elements 6a, 6b, 6c, 6d are connected in parallel by the heat dissipation plate 5c in the first set and the inner lead 13, thus forming the positive arm. As shown in FIG. 17, the switching elements 6e, 6f, 6g, 6h are connected in parallel by the heat dissipation plate 5d in the second set and the negative-arm N terminal 11, thus forming the negative arm. The negative-arm N terminal 11 is connected to the electrodes provided at the surfaces, of the switching elements 6e, 6f, 6g, 6h joined to the one surface of the heat dissipation plate 5d in the second set, that are on the side opposite to the heat dissipation plate 5d side in the second set, and is located to overlap the inner lead 13 with a gap therebetween. One side of the positive-arm P terminal 10 is joined to the element mounting surface 5a of the heat dissipation plate 5c in the first set in the positive arm, and the other side thereof is exposed to the outside of the mold resin 1, to be connected to another device at the outside. One side of the AC terminal 12 is joined to the element mounting surface 5a of the heat dissipation plate 5d in the second set in the negative arm, and the other side thereof is exposed to the outside of the mold resin 1, to be connected to another device at the outside. The heat dissipation plate 5d in the second set, which is at the drain potential of the negative arm, is connected to the inner lead 13, thereby being connected to the source potential of the positive arm. The inner lead 13 connects the positive arm and the negative arm. The inner lead 13 and the negative-arm N terminal 11 are formed in two layers.

In the manufacturing process for the semiconductor device 200, the terminals exposed to the outside from the mold resin 1 shown in FIG. 16 are supported by the same lead frame. With the terminals supported by the lead frame, sealing is made by the mold resin 1, and then the terminals are separated from the lead frame. This process is a general manufacturing process for manufacturing semiconductor devices. In the sealing process, the lead frame is held between an upper die and a lower die of a resin molding mold.

In the present embodiment, the inner lead 13 and the negative-arm N terminal 11 are formed in two layers. In the two-layer structure, in order to avoid interference between these members and the resin molding mold, the inner lead 13 is placed inside the mold resin 1. Therefore, although the sense source terminal 4a for the positive arm has the same potential as the source potential of the switching elements 6a, 6b, 6c, 6d, the sense source terminal 4a needs to be separated from the inner lead 13. Thus, the inner lead 13 and the sense source terminal 4a for the positive arm are provided separately and then connected by the bonding wire 7d.

<Through Holes 11a, 13b>

As shown in FIG. 21, the inner lead 13 and the negative-arm N terminal 11 have through holes communicating with the gap part (part enclosed by a broken line in FIG. 21) between the heat dissipation plate 5c in the first set and the heat dissipation plate 5d in the second set. A through hole 13b of the inner lead 13 and a through hole 11a of the negative-arm N terminal 11 are located to overlap each other as seen in the direction perpendicular to the element mounting surface 5a. Since the inner lead 13 and the negative-arm N terminal 11 are located to overlap each other, if the through holes 11a, 13b are not provided, the mold resin 1 flowing into the gap part between the heat dissipation plate 5c in the first set and the heat dissipation plate 5d in the second set does not readily flow into the gap between the inner lead 13 and the negative-arm N terminal 11. Providing the through holes 11a, 13b enables the mold resin 1 to readily flow also into the gap between the inner lead 13 and the negative-arm N terminal 11 as shown by an arrow in FIG. 21. Since the mold resin 1 is provided in the gap between the inner lead 13 and the negative-arm N terminal 11, insulation property of the inner lead 13 and the negative-arm N terminal 11 can be improved. Since insulation property of the inner lead 13 and the negative-arm N terminal 11 is improved, reliability of the semiconductor device 200 can be improved. In the present embodiment, the semiconductor device 200 has through holes at two locations as shown in FIG. 17. However, the number of through-hole locations is not limited thereto, and through holes may be provided at more locations.

As described above, in the semiconductor device 200 according to the seventh embodiment, two sets of the pluralities of switching elements 6, the heat dissipation plates 5, the gate terminals 4b, and the sense terminals 4c, are provided, the heat dissipation plate 5c in the first set and the heat dissipation plate 5d in the second set are arranged adjacently on the same plane, the cutout 5b of the heat dissipation plate 5c in the first set is provided at the outer periphery of the heat dissipation plate 5c in the first set on the side opposite to the heat dissipation plate 5d in the second set, the cutout 5b of the heat dissipation plate 5d in the second set is provided at the outer periphery of the heat dissipation plate 5d in the second set on the side opposite to the heat dissipation plate 5c in the first set, the gate terminal 4b and the sense terminal 4c in the first set extend to the side opposite to the heat dissipation plate 5d in the second set, and the gate terminal 4b and the sense terminal 4c in the second set extend to the side opposite to the heat dissipation plate 5c in the first set. Therefore, the cutouts 5b can be formed in both the heat dissipation plate 5c in the first set and the heat dissipation plate 5d in the second set arranged adjacently on the same plane. Thus, size increase of the semiconductor device 200 in the directions in which the gate terminals 4b and the sense terminals 4c extend can be suppressed.

The inner lead 13 and the negative-arm N terminal 11 have through holes communicating with a gap part between the heat dissipation plate 5c in the first set and the heat dissipation plate 5d in the second set. Thus, the mold resin 1 can readily flow also into the gap between the inner lead 13 and the negative-arm N terminal 11, whereby insulation property of the inner lead 13 and the negative-arm N terminal 11 can be improved. In addition, since insulation property of the inner lead 13 and the negative-arm N terminal 11 is improved, reliability of the semiconductor device 200 can be improved.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 mold resin
2 P terminal
3 N terminal
4 control terminal
4a sense source terminal
4b gate terminal
4c sense terminal
5 heat dissipation plate
5a element mounting surface
5b cutout
5c heat dissipation plate in first set
5d heat dissipation plate in second set
5e retracted portion
5f cooling surface
5g deep-side retracted portion
6 switching element
7a bonding wire
7b bonding wire
7c bonding wire
7d bonding wire
8 sense element
9 gate electrode
10 positive-arm P terminal
11 negative-arm N terminal
11a through hole
12 AC terminal
13 inner lead
13a extending portion
13b through hole
14 cooler
15 insulating plate
16 creepage distance
16a horizontal distance
16b horizontal distance
100 semiconductor device
200 semiconductor device
300 semiconductor device
500 semiconductor module
600 semiconductor module
X first reference line
Y second reference line

What is claimed is:

1. A semiconductor device comprising:
    a heat dissipation plate formed in a plate shape;
    a plurality of switching elements joined to one surface of the heat dissipation plate;
    a first terminal located apart from the heat dissipation plate and extending in a direction away from the heat dissipation plate, the first terminal being connected via first conductors to surfaces of the plurality of switching elements on a side opposite to the heat dissipation plate side; and
    a sealing member sealing the plurality of switching elements, the heat dissipation plate, and the first terminal, wherein
    a cutout is provided at an outer periphery of the heat dissipation plate,
    a part of the first terminal on the heat dissipation plate side overlaps a cut-out area at the cutout as seen in a direction perpendicular to the one surface of the heat dissipation plate, and
    a retracted portion retracted inward is formed at an outer periphery of another surface of the heat dissipation plate.

2. The semiconductor device according to claim 1, wherein
    the retracted portion is a chamfer portion.

3. The semiconductor device according to claim 1, wherein
    the retracted portion is formed by a step where the outer periphery of the other surface of the heat dissipation plate is retracted to the one surface side of the heat dissipation plate.

4. The semiconductor device according to claim 1, wherein
    the retracted portion is formed at the outer periphery of the other surface of the heat dissipation plate excluding a part at the cutout.

5. The semiconductor device according to claim 4, wherein
    at a deep-side part which is a part of the heat dissipation plate positioned on a deep side of the cutout, a deep-side retracted portion retracted inward is formed on the one surface of the heat dissipation plate at the deep-side part.

6. The semiconductor device according to claim 5, wherein
    the deep-side retracted portion is formed by a slope surface formed on a surface on the cutout side at the deep-side part, and the slope surface is gradually sloped from the cutout side to the heat dissipation plate side, as approaching toward the one surface from the other surface of the heat dissipation plate.

7. The semiconductor device according to claim 5, wherein
the deep-side retracted portion is formed by a step where the one surface of the heat dissipation plate at the deep-side part is retracted to the other surface side of the heat dissipation plate.

8. The semiconductor device according to claim 1, wherein
two sets of pluralities of the switching elements, the heat dissipation plates, and the first terminals are provided,
the heat dissipation plate in a first set and the heat dissipation plate in a second set are arranged adjacently on the same plane,
the cutout of the heat dissipation plate in the first set is provided at an outer periphery of the heat dissipation plate in the first set on a side opposite to the heat dissipation plate in the second set,
the cutout of the heat dissipation plate in the second set is provided at an outer periphery of the heat dissipation plate in the second set on a side opposite to the heat dissipation plate in the first set,
the first terminal in the first set extends to the side opposite to the heat dissipation plate in the second set,
the first terminal in the second set extends to the side opposite to the heat dissipation plate in the first set,
the semiconductor device further comprises:
an inner lead connecting the one surface of the heat dissipation plate in the second set, and electrodes provided at surfaces, of the switching elements joined to the one surface of the heat dissipation plate in the first set, that are on the side opposite to the heat dissipation plate side; and
a negative-arm N terminal connected to electrodes provided at surfaces, of the switching elements joined to the one surface of the heat dissipation plate in the second set, that are on the side opposite to the heat dissipation plate side, the negative-arm N terminal being located to overlap the inner lead with a gap therebetween, and
the inner lead and the negative-arm N terminal have through holes communicating with a gap part between the heat dissipation plate in the first set and the heat dissipation plate in the second set.

9. A semiconductor module comprising:
the semiconductor device according to claim 1; and
a plate-shaped insulating member contacting with the other surface of the heat dissipation plate excluding the retracted portion.

* * * * *